(12) United States Patent
Zheng et al.

(10) Patent No.: US 11,087,815 B2
(45) Date of Patent: Aug. 10, 2021

(54) READOUT CIRCUIT OF MAGNETIC MEMORY AND MAGNETIC MEMORY

(71) Applicants: Semiconductor Manufacturing International (Shanghai) Corporation, Shanghai (CN); Semiconductor Manufacturing International (Beijing) Corporation, Beijing (CN)

(72) Inventors: Siwen Zheng, Shanghai (CN); Hao Ni, Shanghai (CN); Tengye Wang, Shanghai (CN); Tao Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/828,346

(22) Filed: Mar. 24, 2020

(65) Prior Publication Data

US 2020/0312397 A1    Oct. 1, 2020

(30) Foreign Application Priority Data

Mar. 26, 2019    (CN) .......................... 201910232563.6

(51) Int. Cl.
*G11C 7/10*    (2006.01)
*G11C 11/16*    (2006.01)

(52) U.S. Cl.
CPC ................................ *G11C 11/1673* (2013.01)

(58) Field of Classification Search
CPC .................................................... G11C 11/1673
USPC ......................................................... 365/158
See application file for complete search history.

(56) References Cited

U.S. PATENT DOCUMENTS

| 7,633,809 B2 * | 12/2009 | Kajiyama | G11C 7/065 |
| | | | 365/185.24 |
| 2007/0121377 A1 * | 5/2007 | Kajiyama | G11C 7/067 |
| | | | 365/185.02 |

* cited by examiner

*Primary Examiner* — Xiaochun L Chen
(74) *Attorney, Agent, or Firm* — Anova Law Group, PLLC

(57) ABSTRACT

Readout circuit and magnetic memory are provided. The readout circuit includes a first charging capacitor with one end grounded and another end coupled to an output of a data unit; a first pre-charge module for charging the first charging capacitor; a first discharge control module for controlling a magnitude of a data voltage; a second charging capacitor with one end grounded and another end coupled to an output of a reference unit; a second pre-charge module for charging the second charging capacitor; a second discharge control module for controlling a magnitude of a reference voltage; and a sense amplifier for outputting readout signals.

20 Claims, 2 Drawing Sheets

US 11,087,815 B2

READOUT CIRCUIT OF MAGNETIC MEMORY AND MAGNETIC MEMORY

CROSS-REFERENCES TO RELATED APPLICATIONS

This application claims priority of Chinese Patent Application No. 201910232563.6, filed on Mar. 26, 2019, the entire contents of which are hereby incorporated by reference.

FIELD OF THE DISCLOSURE

The present disclosure generally relates to the field of integrated circuit technologies and, more particularly, relates to a readout circuit of a magnetic memory and a magnetic memory.

BACKGROUND

A spin transfer torque magnetic random-access memory (STT-MRAM) brings together the advantages of multiple memories. Integration degree of STT-MRAM can be comparable to that of dynamic random-access memory. High-speed literacy of STT-MRAM can be comparable to that of static random-access memory. A STT-MRAM has other capabilities such as non-volatility of flash, and unlimited number of readings and writes. A STT-MRAM uses a spin transfer torque effect to invert a free layer magnetic moment by an applied electric current, so that a magnetic tunnel junction (MTJ) exhibits two different resistance states. When the free layer magnetic moment is parallel to a reference layer, it exhibits a low resistance RP, which realizes writing "0". When the direction of the free layer magnetic moment is opposite to the reference layer, it exhibits a high resistance RAP and realizes writing "1". Tunneling magneto resistance (TMR)=(RAP−RP)/RP× 100%, where RAP represents a high resistance of MTJ, and RP represents a low resistance of MTJ. The TMR can indicate the distinguishability of the two resistance states of MTJ. The higher the TMR, the better the MTJ performance.

FIG. 1 illustrates a schematic diagram of a readout circuit. RMTJ is a read unit resistance, and Rref is a reference unit resistance. Vx is a read cell voltage, and Vref is a reference cell voltage. After the read cell voltage Vx is compared with the reference cell voltage Vref by a sense amplifier (SA), the data is read out.

Due to limits of materials and processes, the resistance ratio of two states of an MTJ cannot be reached very high, resulting in a limited readout window. In order to enlarge a decision window, a read current Iread can be increased. However, the large current may affect the reliability of the read unit, and the magnetoresistance state of the MTJ, to make stored data change, resulting in a read crosstalk. While too small read current requires additional read time. In addition, since unselected memory cells on a bit line may generate leakage, the reference input port Vref of the sense amplifier is affected by the leakage of reference cells on the bit line and cannot be maintained at its initial level. As shown in FIG. 2, the reference voltage Vref is changed from an initial value to a dynamic value, resulting in a smaller decision window 3 of the read cell voltage Vx in a low resistance state.

In order to solve the technical problem of how to improve the readout accuracy and reliability of a magnetic memory, a readout circuit of the magnetic memory is provided in the present disclosure.

BRIEF SUMMARY OF THE DISCLOSURE

One aspect of the present disclosure provides a readout circuit of a magnetic memory. The readout circuit includes a first charging capacitor, having one end grounded, and another end coupled to an output end of the data unit; a first pre-charge module, coupled to the other end of the first charging capacitor for charging the first charging capacitor; a first discharge control module, having a control end coupled to the other end of the first charging capacitor, having an input end connected to a power supply voltage, and having an output end for outputting a data voltage, configured to control a magnitude of the data voltage according to a discharge speed of the first charging capacitor; a second charging capacitor, having one end grounded, and another end coupled to the output end of the reference unit; a second pre-charge module, coupled to the other end of the second charging capacitor for charging the second charging capacitor; a second discharge control module, having a control end coupled to the other end of the second charging capacitor, having an input end connected to a power supply voltage, and having an output end for outputting a reference voltage, configured to control a magnitude of the reference voltage according to a discharge speed of the second charging capacitor; and a sense amplifier, having input ends input the data voltage and the reference voltage, and having an output end for outputting readout signals.

Another aspect of the present disclosure provides a magnetic memory. The magnetic memory includes a data unit, a reference unit, and the readout circuit having an input end being coupled to the data unit and the reference unit. The readout circuit includes a first charging capacitor, having one end grounded, and another end coupled to an output end of the data unit; a first pre-charge module, coupled to the other end of the first charging capacitor for charging the first charging capacitor; a first discharge control module, having a control end coupled to the other end of the first charging capacitor, having an input end connected to a power supply voltage, and having an output end for outputting a data voltage, configured to control a magnitude of the data voltage according to a discharge speed of the first charging capacitor; a second charging capacitor, having one end grounded, and another end coupled to the output end of the reference unit; a second pre-charge module, coupled to the other end of the second charging capacitor for charging the second charging capacitor; a second discharge control module, having a control end coupled to the other end of the second charging capacitor, having an input end connected to a power supply voltage, and having an output end for outputting a reference voltage, configured to control a magnitude of the reference voltage according to a discharge speed of the second charging capacitor; and a sense amplifier, having input ends input the data voltage and the reference voltage, and having an output end for outputting readout signals.

Other aspects or embodiments of the present disclosure can be understood by those skilled in the art in light of the description, the claims, and the drawings of the present disclosure.

DETAILED DESCRIPTION

Figure 2:
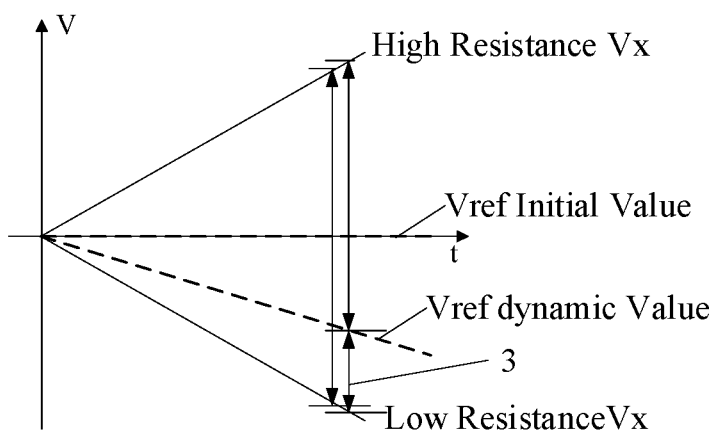
FIG. 2 illustrates a schematic diagram of a readout window.

Due to limits of materials and processes, the resistance ratio of two states of an MTJ cannot be reached very high, resulting in a limited readout window. In order to enlarge a decision window, a read current Iread can be increased. However, the large current may affect the reliability of the read unit, and the magnetoresistance state of the MTJ, to make stored data change, resulting in a read crosstalk. While too small read current requires additional read time. In addition, since unselected memory cells on a bit line may generate leakage, the reference input port Vref of the sense amplifier is affected by the leakage of reference cells on the bit line and cannot be maintained at its initial level. As shown in FIG. 2, the reference voltage Vref is changed from an initial value to a dynamic value, resulting in a smaller decision window 3 of the read cell voltage Vx in a low resistance state.

In the technical solution provided in the present disclosure, a readout circuit of a magnetic memory includes a first charging capacitor and a first pre-charge module. The first pre-charge module can charge the first charging capacitor. The readout circuit may further include a second charging capacitor and a second pre-charge module. The second pre-charge module can charge the second charging capacitor. One end of the first charging capacitor is coupled to an output end of a data unit. One end of the second charging capacitor is coupled to an output end of a reference unit. Since the resistances of the data unit and the reference unit are different, after the data unit and the reference unit are turned on, the discharge speeds of the first charging capacitor and the second charging capacitor are different. The readout circuit of the magnetic memory further includes a first discharge control module and a second discharge control module, which can control the outputted data voltage according to the discharge speed of the first charging capacitor and the outputted reference voltage according to the discharge speed of the second charging capacitor, to realize readouts of data unit signals. Moreover, different data voltages and reference voltages are generated through different charging capacitor discharge speeds caused by different resistances of the data unit and the reference unit, thereby avoiding an unbalanced decision window caused by a leakage current of a reference bit line in the prior art, and ensuring a balance of decision window and reliability and accuracy of data reading.

Figure 3:
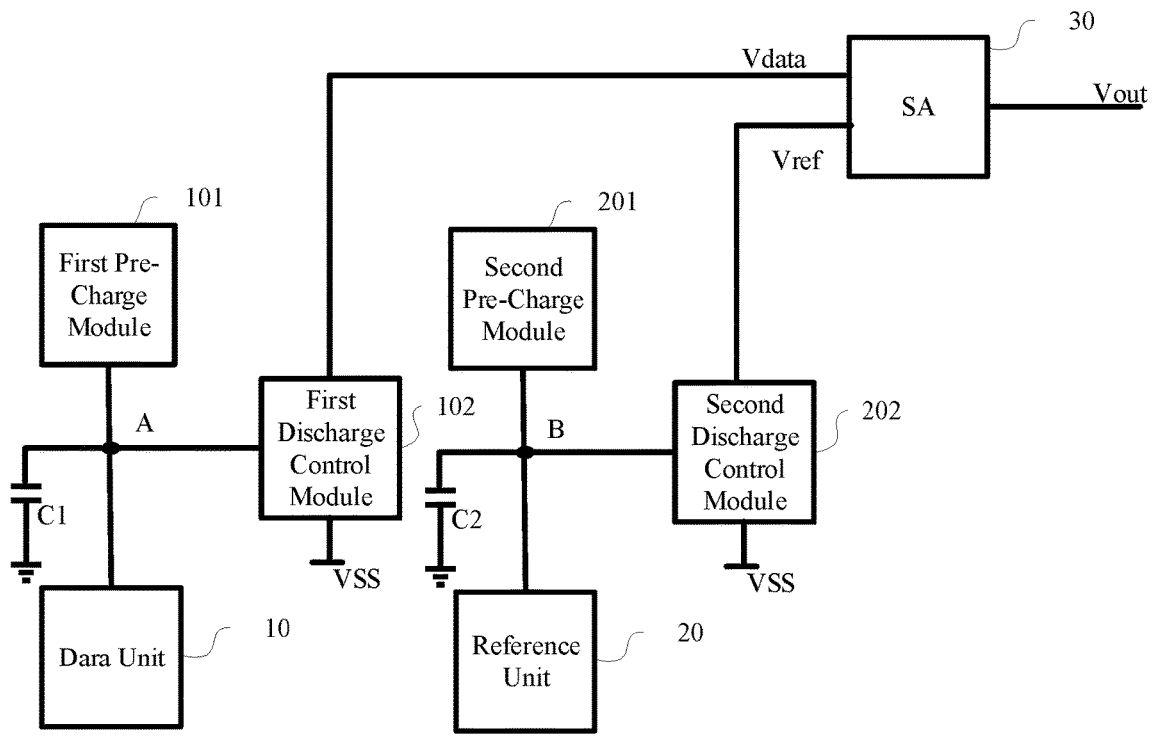
FIG. 3 illustrates a schematic diagram of a readout circuit consistent with various disclosed embodiments in the present disclosure.

FIG. 3 illustrates a schematic diagram of a readout circuit consistent with various disclosed embodiments in the present disclosure. A data unit 10 and a reference unit 20 are components of a magnetic random-access memory (MRAM). The data unit 10 can store data, and the reference unit 20 can provide a reference voltage. Input ends of the readout circuit are coupled to an output end of the data unit 10 and an output end of the reference unit 20 respectively, to read data stored in the data unit 10.

The readout circuit may include a first charging capacitor C1, a first pre-charge module 101, and a first discharging control module 102. One end of the first charging capacitor C1 is grounded, and another end of the first charging capacitor C1 is coupled to an output end of the data unit 10. The first pre-charge module 101 is coupled to another end of the first charging capacitor C1 for charging the first charging capacitor C1. A control end of the first discharge control module 102 is coupled to another end of the first charging capacitor C1. An input end of the first discharge control module 102 is connected to a power supply voltage VSS. An output end of the first discharge control module 102 outputs a data voltage Vdata, the value of which is controlled by a discharge speed of the first charging capacitor C1.

The readout circuit may further include a second charging capacitor C2, a second pre-charge module 201, and a second discharging control module 202. One end of the second charging capacitor C2 is grounded, and another end of the second charging capacitor C2 is coupled to an output end of the reference unit 20. The second pre-charge module 201 is coupled to another end of the second charging capacitor C2 for charging the second charging capacitor C2. A control end of the second discharge control module 202 is coupled to another end of the second charging capacitor C2. An input end of the second discharge control module 202 is connected to the power supply voltage VSS. An output end of the first discharge control module 202 outputs the reference voltage Vref, the value of which is controlled by the discharge speed of the second charging capacitor C2.

In a specific example, the first pre-charge module 101 and the second pre-charge module 201 may be bit line pre-charge modules for charging bit lines in a magnetic memory.

The readout circuit may further include a sense amplifier SA30. Input ends of the sense amplifier SA30 respectively input the data voltage Vdata and the reference voltage Vref. An output end of the sense amplifier SA30 outputs readout signals Vout. The sense amplifier SA30 outputs readout signals after the data voltage Vdata and the reference voltage Vref are compared and amplified.

In one embodiment, the sense amplifier SA30 is a latch amplifier.

In one embodiment, the first pre-charge module 101 pre-charges the first charging capacitor C1. The second pre-charge module 201 pre-charges the second charging capacitor C2. The pre-charge levels of the first charging capacitor C1 and the second charging capacitor C2 are the same. When a word line is turned on, the first charging capacitor C1 is discharged, and a potential at point A changes. When the reference unit 20 is turned on, the second charging capacitor C2 is discharged, and a potential at point B changes. Since resistances of the data unit 10 and a reference unit 20 are different, the discharge times of the first charging capacitor C1 and the second charging capacitor C2 are different. The longer the discharge time, the less residual charge data and the lower residual voltage.

In one specific implementation, the data unit 10 of the magnetic memory has two resistance states: high resistance and low resistance. When a resistance state of the data unit 10 is a low resistance and is smaller than a resistance of the reference unit 20, a discharge speed at the point A is fast, the discharge speed of the first discharge control module 102 is also fast, and the residual charge of the first discharge control module 102 is much, and the data voltage Vdata is large; a discharge speed at the point B is slow, the discharge speed of the second discharge control module 202 is also slow, the residual charge of the second discharge control module 202 is little, and the reference voltage Vref is small.

Similarly, when a resistance state of the data unit 10 is a high resistance and is larger than the resistance of the reference unit 20, the discharge speed at the point A is slow, the discharge speed of the first discharge control module 102 is also slow, and the residual charge of the first discharge control module 102 is little, and the data voltage Vdata is small; the discharge speed at the point B is fast, the discharge speed of the second discharge control module 202 is also fast, the residual charge of the second discharge control module 202 is much, and the reference voltage Vref is large.

Reading of data (ie, 0 or 1) in the data unit 10 is achieved through the magnitude relationship of data voltage Vdata and reference voltage Vref in different resistance states of the data unit 10.

In one embodiment, the readout circuit of the magnetic memory includes a first charging capacitor and a first pre-charging module. The first pre-charge module can charge the first charging capacitor. The readout circuit may further include a second charging capacitor and a second pre-charge module. The second pre-charge module can charge the second charging capacitor. One end of the first charging capacitor is coupled to an output end of a data unit. One end of the second charging capacitor is coupled to an output end of a reference unit. Since the resistances of the data unit and the reference unit are different, after the data unit and the reference unit are turned on, the discharge speeds of the first charging capacitor and the second charging capacitor are different. The readout circuit of the magnetic memory further includes a first discharge control module and a second discharge control module, which can control the outputted data voltage according to the discharge speed of the first charging capacitor and the outputted reference voltage according to the discharge speed of the second charging capacitor, to realize readouts of data unit signals. Moreover, different data voltages and reference voltages are generated through different charging capacitor discharge speeds caused by different resistances of the data unit and the reference unit, thereby avoiding an unbalanced decision window caused by a leakage current of a reference bit line in the prior art, and ensuring a balance of decision window and reliability and accuracy of data reading.

In one specific embodiment, a capacitance value of the first charging capacitor C1 is consistent with a capacitance value of the second charging capacitor C2. The pre-charging potential, after the first pre-charging module 101 pre-charges the first charging capacitor C1, is consistent with the pre-charging potential after the second pre-charging module 201 pre-charges the second charging capacitor C2.

Figure 4:
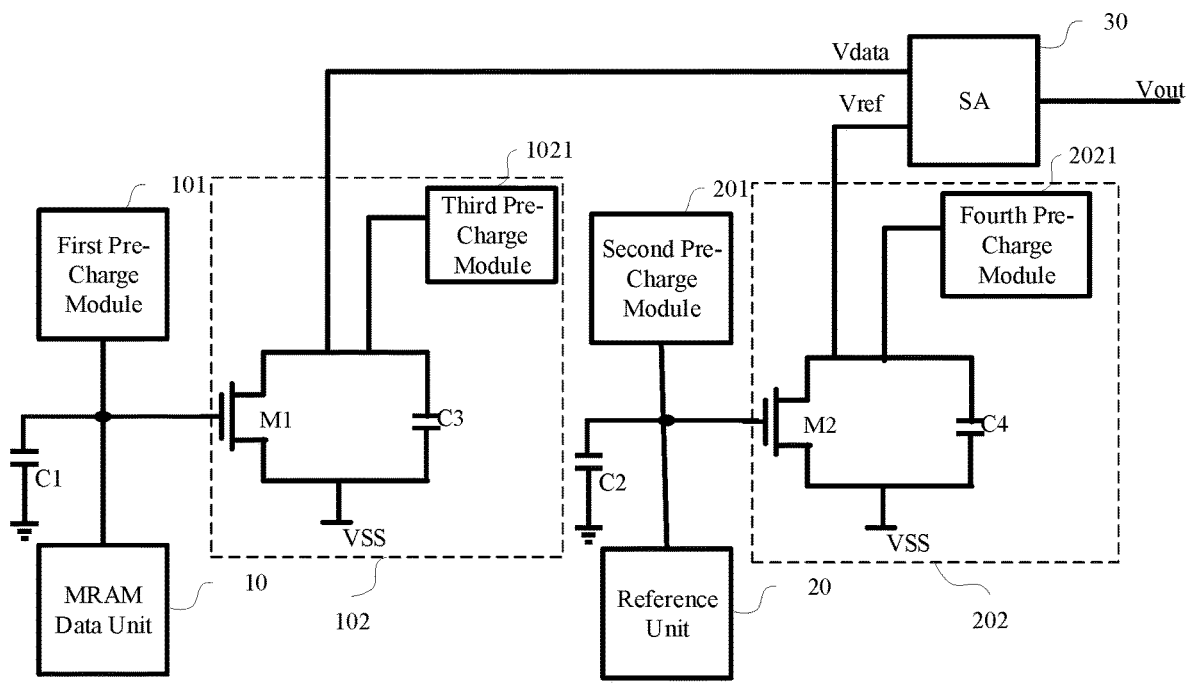
FIG. 4 illustrates a schematic diagram of another readout circuit consistent with various disclosed embodiments in the present disclosure.

In one non-limiting embodiment, referring to FIG. 4, the first discharge control module 102 may include a first switch element M1, a third charging capacitor C3, and a third pre-charging module 1021.

A control end of the first switch element M1 is coupled to one end of the first charging capacitor C1. An input end of the first switch element M1 is connected to the power supply voltage VSS. An output end of the first switch element M1 outputs the data voltage Vdata. One end of the third charging capacitor C3 is connected to the power supply voltage. The third pre-charging module 1021 is coupled to another end of the third charging capacitor C3 for charging the third charging capacitor C3.

Specifically, the first switch element M1 may be a transistor, a gate of which is coupled to another end of the first charging capacitor C1.

Further, the second discharge control module 202 may include a second switch element M2, a fourth charging capacitor C4, and a fourth pre-charging module 2021.

A control end of the second switch element M2 is coupled to one end of the second charging capacitor C2. An output end of the second switch element M2 outputs the reference voltage Vref. An input end of the second switch element M2 is connected to the power supply voltage VSS. One end of the fourth charging capacitor C4 is connected to the power supply voltage VSS. The fourth pre-charging module 2021 is coupled to another end of the fourth charging capacitor C4 for charging the fourth charging capacitor C4.

Specifically, the second switch element M2 may be a transistor, a gate of which is coupled to another end of the second charging capacitor C2.

In a specific implementation, the data unit 10 of the magnetic memory has two resistance states: high resistance and low resistance. When the resistance state of the data unit 10 is a low resistance and is smaller than the resistance of the reference unit 20, the discharge speed at the point A is fast, the switching speed of the first switch element M1 is also fast, the discharge speed of the third charging capacitor C3 is fast, the residual charge of the third charging capacitor C3 is much, and the data voltage Vdata is large; the discharge speed at the point B is slow; the switching speed of the second switch element M2 is also slow, the discharge speed of the fourth charging capacitor C4 is slow, the residual charge of the fourth charging capacitor C4 is little, and the reference voltage Vref is small.

Similarly, when the resistance state of the data unit 10 is high resistance and is larger than the resistance of the reference unit 20, the discharge speed at the point A is slower, the switching speed of the first switch element M1 is also slow, the discharge speed of the third charging capacitor C3 is slow, the residual charge of the third charging capacitor C3 is little, and the data voltage Vdata is small; the discharge speed at the point B is fast, the switching speed of the second switch element M2 is also fast, the discharge speed of the fourth charging capacitor C4 is fast, the residual charge of the fourth charging capacitor C4 is much, and the reference voltage Vref is large.

In one non-limiting specific embodiment, a capacitance value of the third charging capacitor C3 is consistent with a capacitance value of the fourth charging capacitor C4. The pre-charging potential, after the third pre-charging module 1021 pre-charges the third charging capacitor C3, is consistent with the pre-charging potential after the fourth pre-charging module 2021 pre-charges the fourth charging capacitor C4.

That is, the third pre-charging module 1021 and the fourth pre-charging module 2021 pre-charge the data voltage Vdata and the reference voltage Vref to a same potential respectively.

In one specific embodiment, the capacitance value of the first charging capacitor C1 is greater than the capacitance value of the third charging capacitor C3. The capacitance value of the second charging capacitor C2 is greater than the capacitance value of the fourth charging capacitor C4.

In one embodiment, in order to enable a conduction of the first switch element M1, there is a certain requirement on the voltage of a control end of the first switch element M1. One end of the first charging capacitor C1 is coupled to a control end of the first switch element M1. Thereby, the first charging capacitor C1 can be set to have a large capacitance value. Similarly, the second charging capacitor C2 also has a large capacitance value.

The first switch element M1 and the second switch element M2 may also be transmission gates.

It is found through experiments that, in one embodiment, if the readout circuit in the present disclosure is applied, when the data unit 10 of the magnetic memory is in a high resistance state, a voltage difference (sensing margin) between the data voltage Vdata and the reference voltage Vref is 865 millivolts. (mV), a read time is 1 microsecond (ms). If a readout circuit in the prior art is applied, a voltage difference between the data voltage Vdata and the reference voltage Vref is 51 mV, and a reading time is 1.5 ms.

When the data unit 10 of the magnetic memory is in a low resistance state, a voltage difference (sensing margin) between the data voltage Vdata and the reference voltage Vref is 890 mV, a read time is 1 ms. If a readout circuit in the prior art is used, a voltage difference between the data voltage Vdata and the reference voltage Vref is 52.5 mV, and a reading time is 1.5 ms.

The readout circuit provided by the present disclosure can obtain a larger sensing margin and can obtain a faster reading speed than a readout circuit in the prior art.

Figure 1:
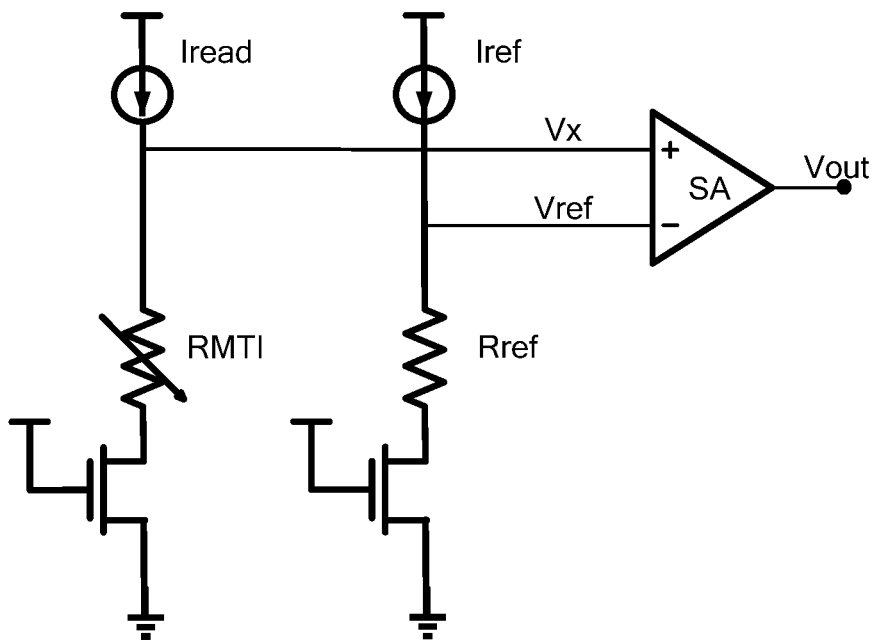
FIG. 1 illustrates a schematic diagram of a readout circuit.

In addition, referring to FIG. 1, the readout circuit in the prior art compares Iref and Icell. Because a reference bit line is affected by leakage, the decision window is biased to one side and the other side is seriously damaged.

In the present disclosure, a reliable decision is made by comparing levels of residual voltages caused by different discharge speeds, and a decision window is roughly balanced.

The present disclosure further discloses a magnetic memory, which may include a data unit and a reference unit. The magnetic memory may further include the readout circuit shown in FIG. 3 or FIG. 4. The magnetic memory may be a spin transfer torque magnetic random-access memory (STT-MRAM), or any other type of magnetic memory that can be implemented.

Compared with the prior art, the technical solution of the present invention has the following beneficial effects.

A readout circuit of a magnetic memory includes a first charging capacitor and a first pre-charge module. The first pre-charge module can charge the first charging capacitor. The readout circuit may further include a second charging capacitor and a second pre-charge module. The second pre-charge module can charge the second charging capacitor. One end of the first charging capacitor is coupled to an output end of a data unit. One end of the second charging capacitor is coupled to an output end of a reference unit. Since the resistances of the data unit and the reference unit are different, after the data unit and the reference unit are turned on, the discharge speeds of the first charging capacitor and the second charging capacitor are different. The readout circuit of the magnetic memory further includes a first discharge control module and a second discharge control module, which can control the outputted data voltage according to the discharge speed of the first charging capacitor and the outputted reference voltage according to the discharge speed of the second charging capacitor, to realize readouts of data unit signals. Moreover, different data voltages and reference voltages are generated through different charging capacitor discharge speeds caused by different resistances of the data unit and the reference unit, thereby avoiding an unbalanced decision window caused by a leakage current of a reference bit line in the prior art, and ensuring a balance of decision window and reliability and accuracy of data reading.

Although the present disclosure has been disclosed above, the present disclosure is not limited thereto. Any changes and modifications can be made by those skilled in the art without departing from the spirit and scope of the invention, and the protection scope of the invention should be determined by the scope defined by the claims.

What is claimed is:

1. A readout circuit of a magnetic memory, an input end of the readout circuit being coupled to a data unit of the magnetic memory and a reference unit, the readout circuit comprising:

a first charging capacitor, having one end grounded, and another end coupled to an output end of the data unit;

a first pre-charge module, coupled to the other end of the first charging capacitor for charging the first charging capacitor;

a first discharge control module, having a control end coupled to the other end of the first charging capacitor, having an input end connected to a power supply voltage, and having an output end for outputting a data voltage, configured to control a magnitude of the data voltage according to a discharge speed of the first charging capacitor;

a second charging capacitor, having one end grounded, and another end coupled to the output end of the reference unit;

a second pre-charge module, coupled to the other end of the second charging capacitor for charging the second charging capacitor;

a second discharge control module, having a control end coupled to the other end of the second charging capacitor, having an input end connected to a power supply voltage, and having an output end for outputting a reference voltage, configured to control a magnitude of the reference voltage according to a discharge speed of the second charging capacitor; and a sense amplifier, having input ends input the data voltage and the reference voltage, and having an output end for outputting readout signals.

2. The readout circuit according to claim 1, wherein:

when the data unit is in a low resistance state and is less than a resistance of the reference unit, the discharge speed of the first charging capacitor is faster than the discharge speed of the second charging capacitor, and the data voltage outputted by the first discharge control module is higher than the reference voltage outputted by the second discharge control module:

when the data unit is in a high resistance state and is greater than the resistance of the reference unit, the discharge speed of the first charging capacitor is slower than the discharge speed of the second charging capacitor, and the data voltage outputted by the first discharge control module is lower than the reference voltage outputted by the second discharge control module.

3. The readout circuit according to claim 1, wherein the capacitance value of the first charging capacitor is consistent with the capacitance value of the second charging capacitor, a pre-charging potential after the first pre-charge module pre-charges the first charging capacitor is consistent with a pre-charging potential after the second pre-charge module pre-charges the second charging capacitor.

4. The readout circuit according to claim 1, wherein the sense amplifier is a latch amplifier.

5. A readout circuit of a magnetic memory, an input end of the readout circuit being coupled to a data unit of the magnetic memory and a reference unit, the readout circuit comprising:

a first charging capacitor, having one end grounded, and another end coupled to an output end of the data unit;

a first pre-charge module, coupled to the other end of the first charging capacitor for charging the first charging capacitor;

a first discharge control module, having a control end coupled to the other end of the first charging capacitor, having an input end connected to a power supply voltage, and having an output end for outputting a data voltage, configured to control a magnitude of the data voltage according to a discharge speed of the first charging capacitor;

a second charging capacitor, having one end grounded, and another end coupled to the output end of the reference unit;

a second pre-charge module, coupled to the other end of the second charging capacitor for charging the second charging capacitor;

a second discharge control module, having a control end coupled to the other end of the second charging capacitor, having an input end connected to a power supply voltage, and having an output end for outputting a reference voltage, configured to control a magnitude of the reference voltage according to a discharge speed of the second charging capacitor; and a sense amplifier, having input ends input the data voltage and the reference voltage, and having an output end for outputting readout signals, wherein the first discharge control module comprises:

a first switch element, having a control end coupled to the other end of the first charging capacitor, having an input end connected to the power supply voltage, and having an output end for outputting the data voltage;

a third charging capacitor, having one end connected to the power supply voltage; and a third pre-charge module coupled to the other end of the third charging capacitor for charging the third charging capacitor.

6. The readout circuit according to claim 5, wherein the second discharge control module comprises:

a second switch element, having a control end coupled to one end of the second charging capacitor, having an input end connected to the power supply voltage, and having an output end for outputting the reference voltage;

a fourth charging capacitor, having one end connected to the power supply voltage; and a fourth pre-charge module coupled to the other end of the fourth charging capacitor for charging the fourth charging capacitor.

7. The readout circuit according to claim 6, wherein a capacitance value of the third charging capacitor is consistent with a capacitance value of the fourth charging capacitor, a pre-charging potential after the third pre-charge module pre-charges the third charging capacitor is consistent with a pre-charging potential after the fourth pre-charge module pre-charges the fourth charging capacitor.

8. The readout circuit according to claim 6, wherein a capacitance value of the first charging capacitor is greater than the capacitance value of the third charging capacitor, and a capacitance value of the second charging capacitor is greater than the capacitance value of the fourth charging capacitor.

9. The readout circuit according to claim 6, wherein the first switch element and the second switch element are MOS tubes or transmission gates.

10. The readout circuit according to claim 5, wherein:

when the data unit is in a low resistance state and is less than a resistance of the reference unit, the discharge speed of the first charging capacitor is faster than the discharge speed of the second charging capacitor, and the data voltage outputted by the first discharge control module is higher than the reference voltage outputted by the second discharge control module:

when the data unit is in a high resistance state and is greater than the resistance of the reference unit, the discharge speed of the first charging capacitor is slower than the discharge speed of the second charging capacitor, and the data voltage outputted by the first discharge control module is lower than the reference voltage outputted by the second discharge control module.

11. The readout circuit according to claim 5, wherein the capacitance value of the first charging capacitor is consistent with the capacitance value of the second charging capacitor, a pre-charging potential after the first pre-charge module pre-charges the first charging capacitor is consistent with a pre-charging potential after the second pre-charge module pre-charges the second charging capacitor.

12. A magnetic memory, comprising:

a data unit, a reference unit, and a readout circuit, having an input end being coupled to the data unit and the reference unit, the readout circuit comprising:

a first charging capacitor, having one end grounded, and another end coupled to an output end of the data unit;

a first pre-charge module, coupled to the other end of the first charging capacitor for charging the first charging capacitor;

a first discharge control module, having a control end coupled to the other end of the first charging capacitor, having an input end connected to a power supply voltage, and having an output end for outputting a data voltage, configured to control a magnitude of the data voltage according to a discharge speed of the first charging capacitor;

a second charging capacitor, having one end grounded, and another end coupled to the output end of the reference unit;

a second pre-charge module, coupled to the other end of the second charging capacitor for charging the second charging capacitor;

a second discharge control module, having a control end coupled to the other end of the second charging capacitor, having an input end connected to a power supply voltage, and having an output end for outputting a reference voltage, configured to control a magnitude of the reference voltage according to a discharge speed of the second charging capacitor; and a sense amplifier, having input ends input the data voltage and the reference voltage, and having an output end for outputting readout signals.

13. The magnetic memory according to claim 12, wherein:

when the data unit is in a low resistance state and is less than a resistance of the reference unit, the discharge speed of the first charging capacitor is faster than the discharge speed of the second charging capacitor, and the data voltage outputted by the first discharge control module is higher than the reference voltage outputted by the second discharge control module:

when the data unit is in a high resistance state and is greater than the resistance of the reference unit, the discharge speed of the first charging capacitor is slower than the discharge speed of the second charging capacitor, and the data voltage outputted by the first discharge control module is lower than the reference voltage outputted by the second discharge control module.

14. The magnetic memory according to claim 12, wherein the first discharge control module comprises:

a first switch element, having a control end coupled to the other end of the first charging capacitor, having an input end connected to the power supply voltage, and having an output end for outputting the data voltage;

a third charging capacitor, having one end connected to the power supply voltage; and a third pre-charge module coupled to the other end of the third charging capacitor for charging the third charging capacitor.

15. The magnetic memory according to claim 14, wherein the second discharge control module comprises:

a second switch element, having a control end coupled to one end of the second charging capacitor, having an input end connected to the power supply voltage, and having an output end for outputting the reference voltage;

a fourth charging capacitor, having one end connected to the power supply voltage; and a fourth pre-charge module coupled to the other end of the fourth charging capacitor for charging the fourth charging capacitor.

16. The magnetic memory according to claim 15, wherein a capacitance value of the third charging capacitor is consistent with a capacitance value of the fourth charging capacitor, a pre-charging potential after the third pre-charge module pre-charges the third charging capacitor is consistent with a pre-charging potential after the fourth pre-charge module pre-charges the fourth charging capacitor.

17. The magnetic memory according to claim 15, wherein a capacitance value of the first charging capacitor is greater than the capacitance value of the third charging capacitor, and a capacitance value of the second charging capacitor is greater than the capacitance value of the fourth charging capacitor.

18. The magnetic memory according to claim 15, wherein the first switch element and the second switch element are MOS tubes or transmission gates.

19. The magnetic memory according to claim 12, wherein the capacitance value of the first charging capacitor is consistent with the capacitance value of the second charging capacitor, a pre-charging potential after the first pre-charge module pre-charges the first charging capacitor is consistent with a pre-charging potential after the second pre-charge module pre-charges the second charging capacitor.

20. The magnetic memory according to claim 12, wherein the sense amplifier is a latch amplifier.

* * * * *